(12) United States Patent
Yang et al.

(10) Patent No.: US 12,402,300 B2
(45) Date of Patent: Aug. 26, 2025

(54) SEMICONDUCTOR DEVICE HAVING CHANNEL REGIONS DISTRIBUTED ON TWO OPPOSITE SIDES OF A GATE ELECTRODE

(71) Applicant: CHANGXIN MEMORY TECHNOLOGIES, INC., Hefei (CN)

(72) Inventors: Mengmeng Yang, Hefei (CN); Yi Tang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 544 days.

(21) Appl. No.: 17/952,262

(22) Filed: Sep. 25, 2022

(65) Prior Publication Data

US 2023/0013060 A1    Jan. 19, 2023

(30) Foreign Application Priority Data

Jun. 28, 2022  (CN) .......................... 202210743273.X

(51) Int. Cl.
*H10B 12/00*   (2023.01)
*G11C 5/06*    (2006.01)

(52) U.S. Cl.
CPC .......... *H10B 12/315* (2023.02); *G11C 5/063* (2013.01); *H10B 12/0335* (2023.02); *H10B 12/053* (2023.02); *H10B 12/34* (2023.02); *H10B 12/488* (2023.02)

(58) Field of Classification Search
CPC .. H10B 12/0335; H10B 12/05; H10B 12/053; H10B 12/30; H10B 12/31; H10B 12/315; H10B 12/34; H10B 12/488; G11C 5/063; H10D 1/716; H10D 62/151; H10D 62/235; H10D 64/01; H10D 64/513
USPC ................................................. 257/296, 903
See application file for complete search history.

(56) References Cited

U.S. PATENT DOCUMENTS

2023/0125896 A1*  4/2023  Kim ................... H10D 30/0415
                                                        257/296

* cited by examiner

*Primary Examiner* — Hoai V Pham
(74) *Attorney, Agent, or Firm* — Kilpatrick Townsend & Stockton LLP

(57) ABSTRACT

Embodiments relate to a semiconductor device and a forming method. The semiconductor device includes: a substrate; a memory array positioned on the substrate and at least including memory cells spaced along a first direction, each of the memory cells including a transistor, the transistor including a gate electrode, channel regions distributed on two opposite sides of the gate electrode along a third direction, and a source region and a drain region distributed on two opposite sides of each of the channel regions along a second direction, the first direction and the third direction being directions parallel to a top surface of the substrate, the first direction intersecting with the third direction, and the second direction being a direction perpendicular to the top surface of the substrate; and a word line extending along the first direction and continuously electrically connected to the gate electrodes spaced along the first direction.

9 Claims, 11 Drawing Sheets

(a)

(b)

(a) (b)

SEMICONDUCTOR DEVICE HAVING CHANNEL REGIONS DISTRIBUTED ON TWO OPPOSITE SIDES OF A GATE ELECTRODE

CROSS-REFERENCE TO RELATED APPLICATION

This application claims priority to Chinese Patent Application No. 202210743273.X, titled "SEMICONDUCTOR DEVICE AND METHOD FOR FORMING SAME" and filed to the State Patent Intellectual Property Office on Jun. 28, 2022, the entire contents of which are incorporated herein by reference.

TECHNICAL FIELD

The present disclosure relates to the field of semiconductor fabrication technology, and more particularly, to a semiconductor device and a method for forming the same.

BACKGROUND

As a semiconductor apparatus commonly used in electronic devices such as computers, Dynamic Random Access Memory (DRAM) comprises a plurality of memory cells, where each of the plurality of memory cells generally includes a transistor and a capacitor. A gate of the transistor is electrically connected to a word line, a source of the transistor is electrically connected to a bit line, and a drain of the transistor is electrically connected to the capacitor. A word line voltage of the word line can control on or off of the transistor, such that data information stored in the capacitor can be read or written into the capacitor by means of the bit line.

With continuous miniature of sizes of semiconductor devices such as the DRAM, the semiconductor devices have developed from two-dimensional structures to three-dimensional stacked structures. However, due to limitations of processes for fabricating the semiconductor devices and fabrication yield of the semiconductor devices, it is difficult to further reduce the sizes of the semiconductor devices.

Therefore, how to simplify the processes for fabricating the semiconductor devices, increase the yield of the semiconductor devices, and improve an integration level of the semiconductor devices is a technical problem to be solved urgently at present.

SUMMARY

A semiconductor device and a method for forming the same are provided by some embodiments of the present disclosure.

According to some embodiments, the present disclosure provides a semiconductor device, which includes: a substrate; a memory array positioned on the substrate and at least comprising a plurality of memory cells spaced along a first direction, each of the plurality of memory cells comprising a transistor, the transistor comprising a gate electrode, channel regions distributed on two opposite sides of the gate electrode along a third direction, and a source region and a drain region distributed on two opposite sides of each of the channel regions along a second direction, the first direction and the third direction being directions parallel to a top surface of the substrate, the first direction intersecting with the third direction, and the second direction being a direction perpendicular to the top surface of the substrate; and a word line extending along the first direction and being continuously electrically connected to the plurality of gate electrodes spaced along the first direction.

According to some other embodiments, the present disclosure further provides a method for forming the semiconductor device, including: providing an initial substrate; and forming, in the initial substrate, a substrate, a memory array positioned above the substrate, and a word line, where the memory array at least comprises a plurality of memory cells spaced along a first direction, each of the plurality of memory cells comprising a transistor, the transistor comprising a gate electrode, channel regions distributed on two opposite sides of the gate electrode along a third direction, and a source region and a drain region distributed on two opposite sides of each of the channel regions along a second direction; the word line extends along the first direction and is continuously electrically connected to the plurality of gate electrodes spaced along the first direction, where the first direction and the third direction are directions parallel to a top surface of the substrate, the first direction intersecting with the third direction, and the second direction being a direction perpendicular to the top surface of the substrate.

DETAILED DESCRIPTION

Embodiments of a semiconductor device and a method for forming the same provided by the present disclosure will be described in detail below with reference to the accompanying drawings.

Figure 1:
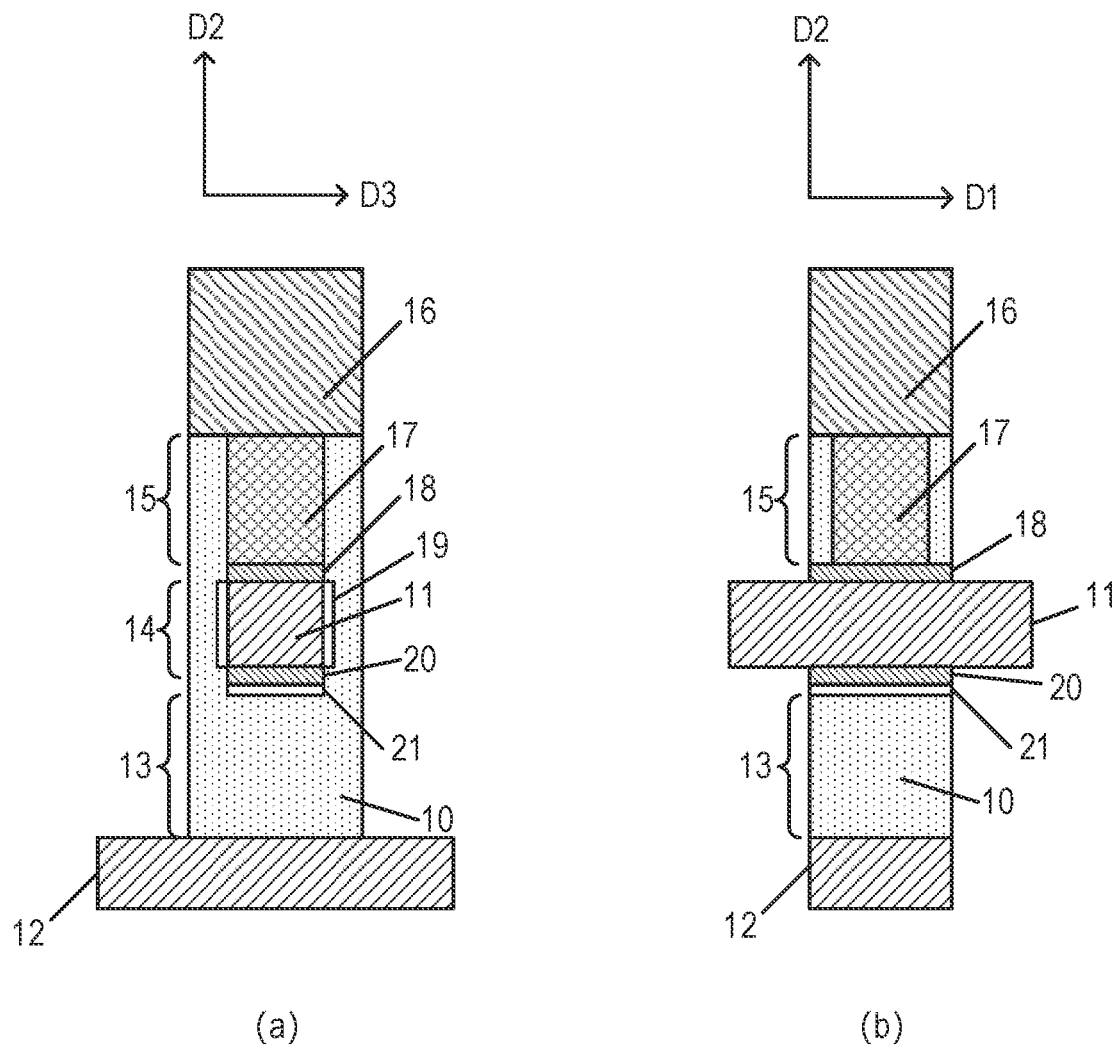
FIG. 1 is a schematic diagram showing a first structure of a semiconductor device according to an embodiment of the present disclosure.
Figure 2A:
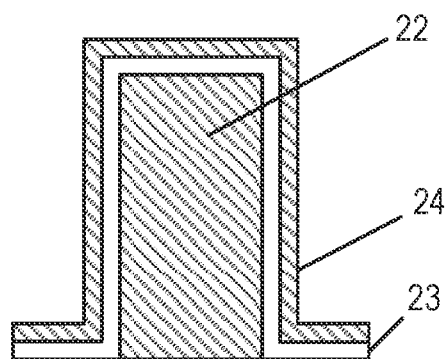
FIGS. 2A to 2B are two schematic structural diagrams of a capacitor in the semiconductor device in FIG. 1.
Figure 2B:
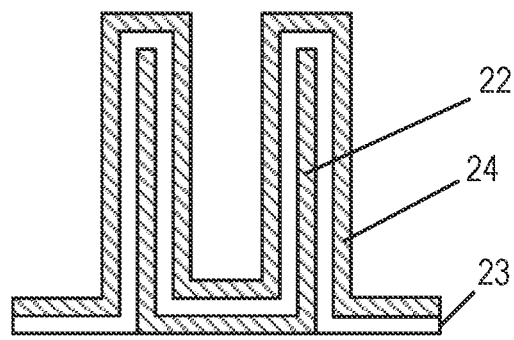
Figure 3:
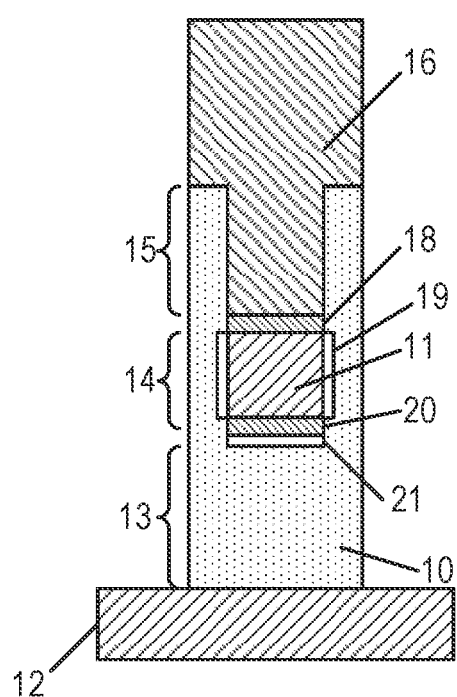
FIG. 3 is a schematic diagram showing a second structure of the semiconductor device according to an embodiment of the present disclosure.
Figure 3:
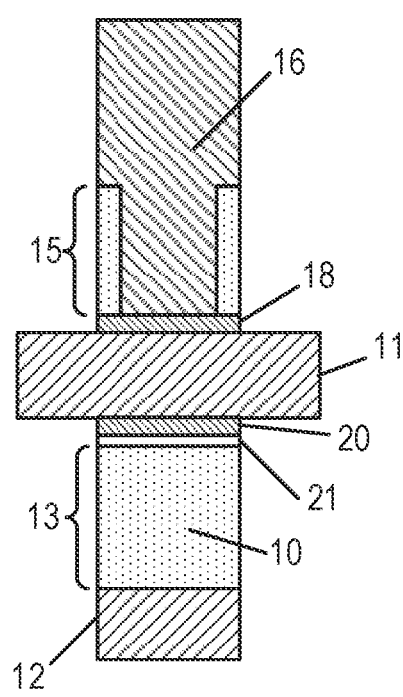
Figure 4A:
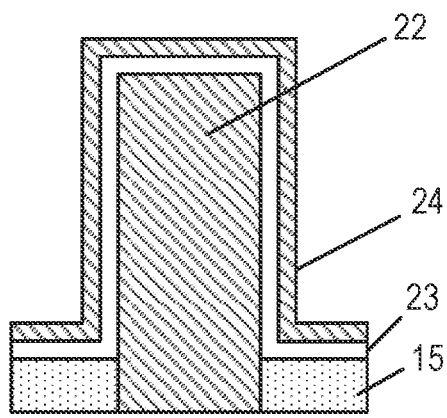
FIGS. 4A to 4B are two schematic structural diagrams of the capacitor in the semiconductor device in FIG. 3.
Figure 4B:
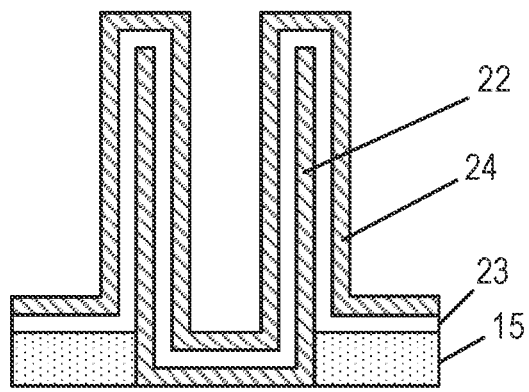
Figure 5:
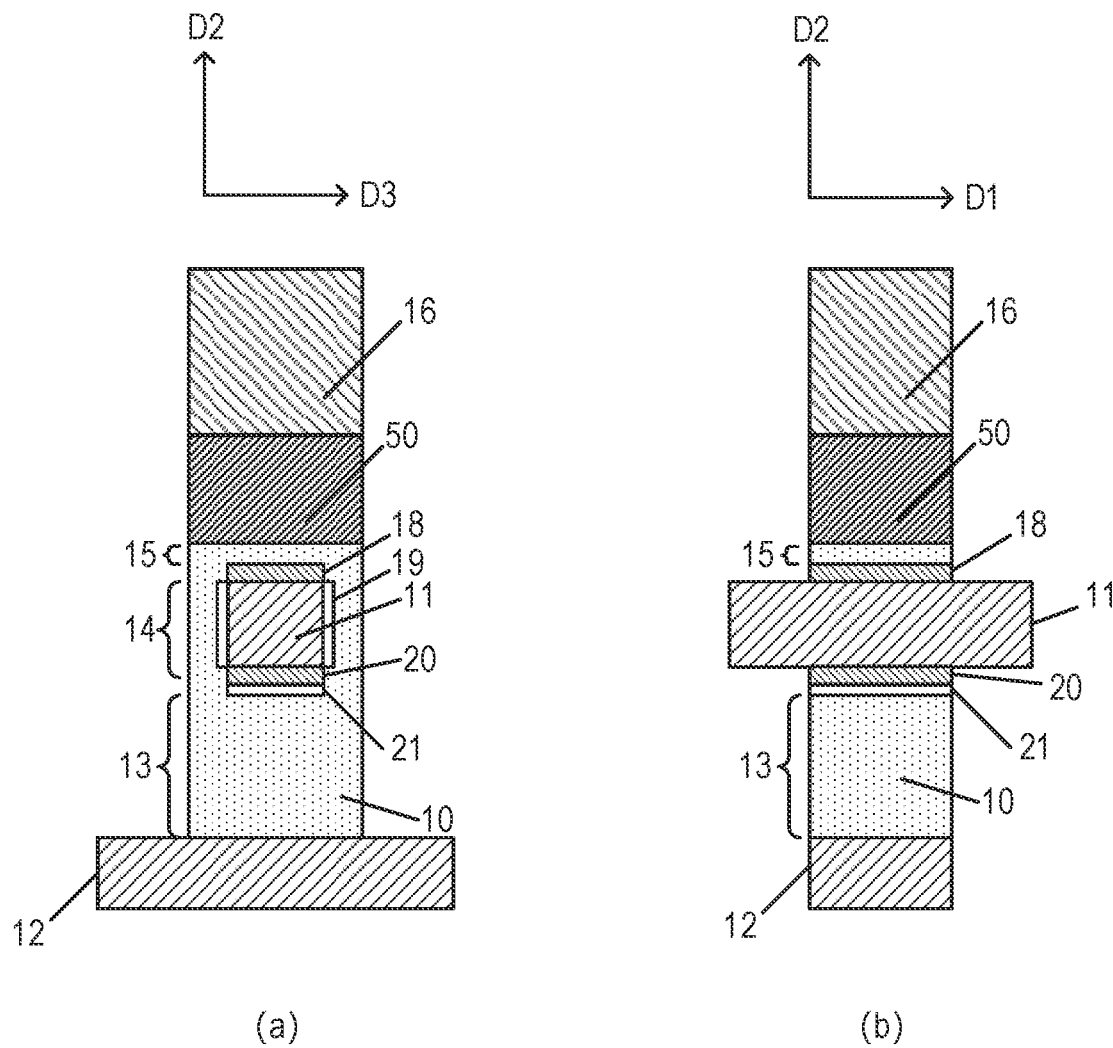
FIG. 5 is a schematic diagram showing a third structure of the semiconductor device according to an embodiment of the present disclosure.
Figure 6A:
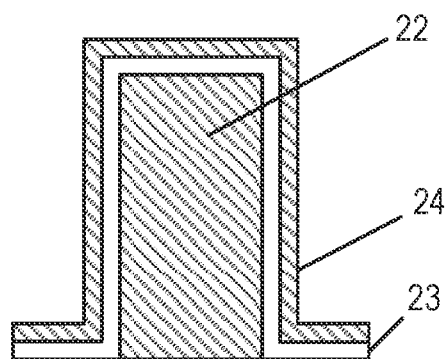
FIG. 6A to FIG. 6B are two schematic structural diagrams of the semiconductor device in FIG. 5.
Figure 6B:
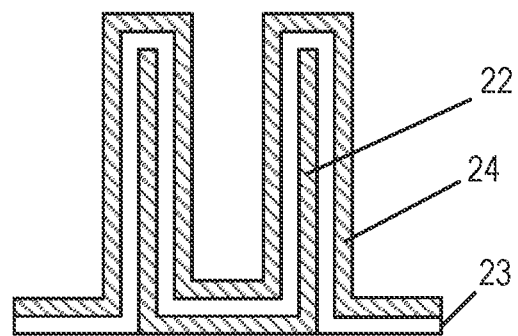
Figure 7:
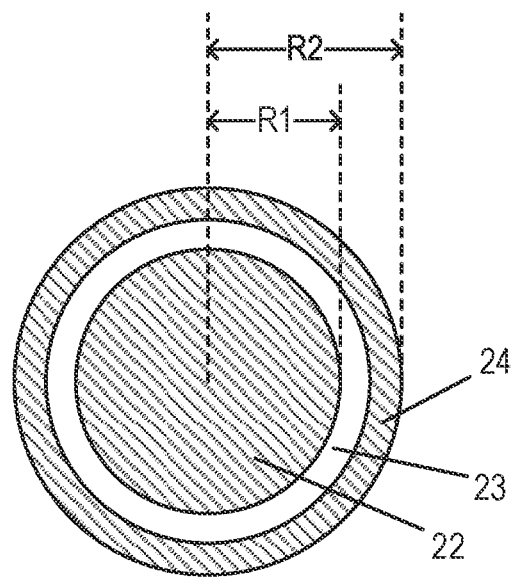
FIG. 7 is a schematic top-down view of the capacitor according to an embodiment of the present disclosure.
Figure 8A:
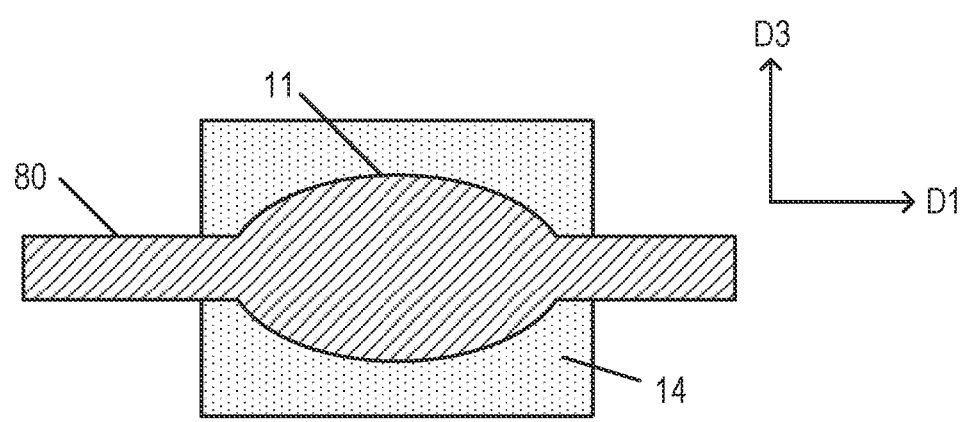
FIGS. 8A to 8B are two schematic structural diagrams showing connection between a gate electrode and a word line according to an embodiment of the present disclosure.
Figure 8B:
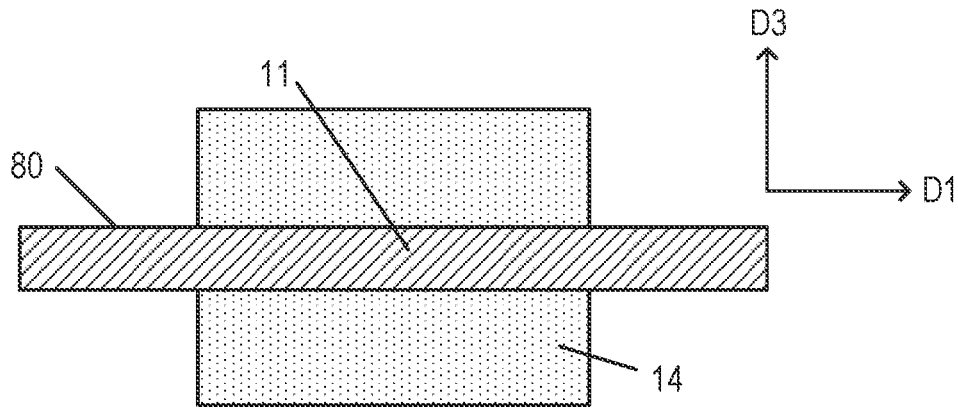

This embodiment provides a semiconductor device. FIG. 1 is a schematic diagram showing a first structure of the semiconductor device according to an embodiment of the present disclosure. FIGS. 2A to 2B are two schematic structural diagrams of a capacitor in the semiconductor device in FIG. 1. FIG. 3 is a schematic diagram showing a second structure of the semiconductor device according to an embodiment of the present disclosure. FIGS. 4A to 4B are two schematic structural diagrams of the capacitor in the semiconductor device in FIG. 3. FIG. 5 is a schematic diagram showing a third structure of the semiconductor device according to an embodiment of the present disclosure. FIG. 6A to FIG. 6B are two schematic structural diagrams of the semiconductor device in FIG. 5. FIG. 7 is a schematic top-down view of the capacitor according to an embodiment of the present disclosure. FIGS. 8A to 8B are two schematic structural diagrams showing connection between a gate electrode and a word line according to an embodiment of the present disclosure. As shown in FIG. 1, FIGS. 2A to 2B, FIG. 3, FIGS. 4A to 4B, FIG. 5, FIGS. 6A to 6B, FIG. 7, and FIGS. 8A to 8B, the semiconductor device includes: a substrate; a memory array positioned on the substrate and at least comprising a plurality of memory cells spaced along a first direction D1, each of the plurality of memory cells comprising a transistor, the transistor comprising a gate electrode 11, channel regions 14 distributed on two opposite sides of the gate electrode 11 along a third direction D3, and a source region 13 and a drain region 15 distributed on two opposite sides of each of the channel regions 14 along a second direction D2, the first direction D1 and the third direction D3 being directions parallel to a top surface of the substrate, the first direction D1 intersecting with the third direction D3, and the second direction D2 being a direction perpendicular to the top surface of the substrate; and a word line 80 extending along the first direction D1 and being continuously electrically connected to the plurality of gate electrodes 11 spaced along the first direction D1.

The semiconductor device in this embodiment may be, but is not limited to, a dynamic random access memory (DRAM). For example, the substrate may be, but is not limited to, a silicon substrate. This embodiment is described by taking an example where the substrate is the silicon substrate. In other embodiments, the substrate may be a semiconductor substrate such as gallium nitride, gallium arsenide, gallium carbide, silicon carbide, or silicon on insulator (SOI). The substrate is configured to support device structures thereon. The top surface of the substrate refers to a surface of the substrate facing towards the memory array. The memory array may include a plurality of the memory cells arranged in an array along the first direction D1 and the third direction D3, where the third direction D3 is a direction parallel to the top surface of the substrate, and the first direction D1 intersects the third direction D3. In one embodiment, the memory array may further include the plurality of memory cells arranged in a three-dimensional array along the first direction D1, the second direction D2 and the third direction D3, thereby further increasing integration degree and storage capacity of the semiconductor device.

The memory cell includes a transistor, which includes an active pillar 10 and the gate electrode 11. In an embodiment, the active pillar 10 may extend along the second direction D2. The active pillar 10 includes the source region 13, the channel region 14, and the drain region 15 stacked in sequence along the second direction D2. The gate electrode 11 is embedded inside the active pillar 10, such that the channel regions 14 are distributed on two opposite sides of the gate electrode 11 along the third direction D3 to form a double-channel structure, such that fabrication difficulty of the semiconductor device is reduced while improving electrical performance of the semiconductor device. The word line 80 extends along the first direction and is continuously electrically connected to the plurality of gate electrodes 11 spaced along the first direction D1. That is, an extension direction of the word line 80 is orthogonal to an extension direction of the active pillar 10 to further improve the integration level of the semiconductor device. In one embodiment, the memory cell further includes a gate dielectric layer 19 between the gate electrode 11 and the channel region 14. A material of the gate dielectric layer 19 may be, but not limited to, an oxide material (such as silicon dioxide).

In some embodiments, a width of the gate electrode 11 along the third direction D3 is greater than or equal to that of the word line 80 along the third direction D3.

In an example, as shown in FIG. 8A, to reduce adverse effects of a short channel effect on the performance of the transistor, the width of the gate electrode 11 along the third direction D3 may be greater than that of the word line 80 along the third direction D3. In another example, as shown in FIG. 8B, to further simplify manufacturing processes of the semiconductor device, the width of the gate electrode 11 along the third direction D3 may be equal to that of the word line 80 along the third direction D3. The intersection mentioned in this embodiment may be a vertical intersection (i.e., orthogonal intersection) or an oblique intersection.

In some embodiments, the semiconductor device further includes: a bit line 12 positioned below the transistor and extending along the third direction D3, where the bit line 12 is electrically connected to the source region 13.

In some embodiments, the bit line 12 extends along the third direction D3 and is continuously electrically connected to the source regions 13 in the plurality of memory cells spaced along the third direction D3. In an embodiment, the bit line 12 may be positioned inside the substrate to form a buried bit line structure, thereby further reducing the size of the semiconductor device. In another embodiment, the bit line 12 may also be positioned above the substrate to simplify a process for forming the bit line 12 and reduce an internal resistance of the bit line 12. A material of the bit line 12 may be metal material or a combination of metal silicide and the metal material, which may be selected by those skilled in the art according to actual needs.

In some embodiments, one of the memory cells further includes: a capacitor structure positioned above the transistor along the second direction D2, where the capacitor structure is electrically connected to the drain region 15; a first isolation layer positioned between the source region 13 and the gate electrode 11; and a second isolation layer 18 positioned between the capacitor structure and the gate electrode 11.

In some embodiments, the first isolation layer may be a single-layer or multi-layer structure, and is configured to electrically isolate the source region 13 from the gate electrode 11. In one embodiment, the first isolation layer includes a first sub isolation layer 21 and a second sub isolation layer 22 positioned above the first sub isolation layer 21 to further reduce a parasitic capacitance effect of the memory cell. A material of the first sub isolation layer 21 may be, but is not limited to, an oxide material (such as silicon dioxide), and a material of the second sub isolation layer 22 may be, but is not limited to, a nitride material (such as silicon nitride). The second isolation layer 18 may also be a single-layer or multi-layer structure (for example, including oxide layers and nitride layers alternately stacked along the second direction D2), to electrically isolate the gate electrode 11 from the capacitor structure.

In some embodiments, as shown in FIG. 1, the capacitor structure includes: a capacitor contact 17 positioned above the gate electrode 11, where the drain region 15 is distributed around a side wall of the capacitor contact 17; and a capacitor 16 positioned above the capacitor contact 17 and electrically connected to the capacitor contact 17.

In some embodiments, as shown in FIG. 2A, the capacitor 16 includes: a lower electrode layer 22 being columnar and extending along the second direction D2, where the lower electrode layer 22 is electrically connected to the drain region 15; a dielectric layer 23 covering a surface of the lower electrode layer 22; and an upper electrode layer 24 covering a surface of the dielectric layer 23.

FIG. 1(a) and FIG. 1(b) are schematic cross-sectional views of the same semiconductor device along different directions. In some embodiments, as shown in FIGS. 1 and 2A, the capacitor structure includes the capacitor contact 17 positioned above the second isolation layer 18, and the drain region 15 is distributed around a side wall of the capacitor contact 17 and is electrically connected to the capacitor contact 17. The capacitor 16 is positioned above the capacitor contact and is in electrical connection with the capacitor contact 17. By arranging the capacitor contact 17, a contact resistance between the capacitor 16 and the drain region 15 can be reduced, and connection stability between the capacitor 16 and the drain region 15 can be enhanced. In an embodiment, a material of the capacitor contact 17 may be a metal material (such as tungsten) or a conductive material such as titanium nitride (TiN).

In an example, the capacitor 16 includes the lower electrode layer 22 covering a top surface of the capacitor contact 17 and having a columnar cross section, the dielectric layer 23 covering the surface of the lower electrode layer 22 and the top surface of the active pillar 10, and the upper electrode layer 24 covering the surface of the dielectric layer 23. In an embodiment, the semiconductor device further includes a common electrode layer covering a surface of the upper electrode layer 24, and the plurality of capacitor structures in the semiconductor device share the common electrode layer. That is, the common electrode layer continuously covers the upper electrode layers 24 of the plurality of capacitors 16. A material of the lower electrode layer 22 and a material of the upper electrode layer 24 may be same or may be different. In an embodiment, to save fabrication costs of the semiconductor device, the material of the lower electrode layer 22 and the material of the upper electrode layer 24 are the same, for example, one or a combination of two or more of TiN, titanium oxide (TiO), and the metal material. The dielectric layer 23 is formed from a material having a higher dielectric constant. In an embodiment, a material of the dielectric layer 23 may be oxide, oxynitride, silicon oxide, or silicon oxynitride containing any one or two or more of hafnium, ruthenium, zirconium, and tantalum. A material of the common electrode layer may be, but is not limited to, polysilicon.

In an example, as shown in FIG. 7, for the capacitor 16 including the lower electrode layer 22 having the columnar cross section, a radius R1 of the lower electrode layer 22 may be 4 nm to 50 nm, a radius R2 of the capacitor 16 may be 10 nm to 70 nm, and a length of the capacitor 16 along the second direction D2 may be 200 nm to 1,500 nm.

In some other embodiments, the capacitor as shown in FIG. 2B includes: a lower electrode layer 22 extending along the second direction D2 and being electrically connected to the drain region 15, where a cross section of the lower electrode layer 22 is U-shaped; a dielectric layer 23 covering a surface of the lower electrode layer 22; and an upper electrode layer 24 covering a surface of the dielectric layer 23.

In some embodiments, the lower electrode layer 22 includes a bottom surface and side surfaces extending along the second direction D2 and distributed around an outer periphery of a bottom surface of the lower electrode layer 22, such that the cross section of the lower electrode layer 22 is U-shaped to increase a surface area of the lower electrode layer 22, thereby increasing a surface area of the capacitor, and finally increasing capacitance of the capacitor 16. The bottom surface of the U-shaped lower electrode layer 22 covers the top surface of the capacitor contact 17 and is electrically connected to the capacitor contact 17, the dielectric layer 23 covers the surface of the lower electrode layer 22, and the upper electrode layer 24 covers the surface of the dielectric layer 23. In an embodiment, the semiconductor device further includes a common electrode layer covering the surface of the upper electrode layer 24, and the plurality of capacitor structures in the semiconductor device share one common electrode layer. That is, the common electrode layer continuously covers the upper electrode layers 24 of the plurality of capacitors 16.

In some other embodiments, as shown in FIG. 3, the capacitor structure includes: a capacitor 16 positioned above the gate electrode 11, where the drain region 15 is distributed around a side wall of part of the capacitor 16.

FIG. 3(a) and FIG. 1(b) are schematic cross-sectional views of the same semiconductor device along different directions. In an example, as shown in FIG. 3 and FIG. 4A, the capacitor 16 includes the lower electrode layer 22 having the columnar cross section, the dielectric layer 23 covering the surface of the lower electrode layer 22, and the upper electrode layer 24 covering the surface of the dielectric layer 23. The drain region 15 is distributed around a side wall of part of the lower electrode layer 22 and is electrically connected to the lower electrode layer 22 to increase a contact area between the drain region 15 and the lower electrode layer 22, and to reduce a contact resistance between the drain region 15 and the lower electrode layer 22. The dielectric layer 23 covers a surface of the lower electrode layer 22 extending out of the active pillar 10 and a top surface of the drain region 15.

In another example, as shown in FIGS. 3 and 4B, the capacitor 16 includes the lower electrode layer 22 with the U-shaped cross section, the dielectric layer 23 covering the surface of the lower electrode layer 22, and the upper electrode layer 24 covering the surface of the dielectric layer 23. The lower electrode layer 22 includes the bottom surface and the side surfaces extending along the second direction D2 and distributed around the outer periphery of the bottom surface of the lower electrode layer 22, such that the cross section of the lower electrode layer 22 is U-shaped to increase the surface area of the lower electrode layer 22, thereby increasing the surface area of the capacitor, and finally increasing the capacitance of the capacitor 16. The drain region 15 is distributed around the side wall of part of the lower electrode layer 22 and is electrically connected to the lower electrode layer 22 to increase the contact area between the drain region 15 and the lower electrode layer 22, and to reduce the contact resistance between the drain region 15 and the lower electrode layer 22.

In some embodiments, as shown in FIG. 5, the capacitor structure includes: a capacitor terminal 50 covering the top surface of the drain region 15; and the capacitor 16 positioned above the capacitor terminal 50 and being electrically connected to the capacitor terminal 50.

FIG. 5(a) and FIG. 1(b) are schematic cross-sectional views of the same semiconductor device along different directions. In an example, as shown in FIG. 5, the capacitor structure includes the capacitor terminal 50 positioned on the top surface of the drain region 15, and the drain region 15 is in electrical connection with the capacitor terminal 50. The capacitor 16 is positioned on a top surface of the capacitor terminal 50 and is in electrical connection with the capacitor terminal 50. By arranging the capacitor terminal 50, a contact resistance between the capacitor 16 and the drain region 15 can be reduced. In an embodiment, a material of the capacitor terminal 50 may be polysilicon. The cross section of the lower electrode layer 22 in the capacitor 16 may be columnar as shown in FIG. 6A to simplify a process for fabricating the capacitor 16. In some embodiments, the cross section of the lower electrode layer 22 in the capacitor 16 may be U-shaped as shown in FIG. 6B to increase capacitance of the capacitor 16.

Figure 9:
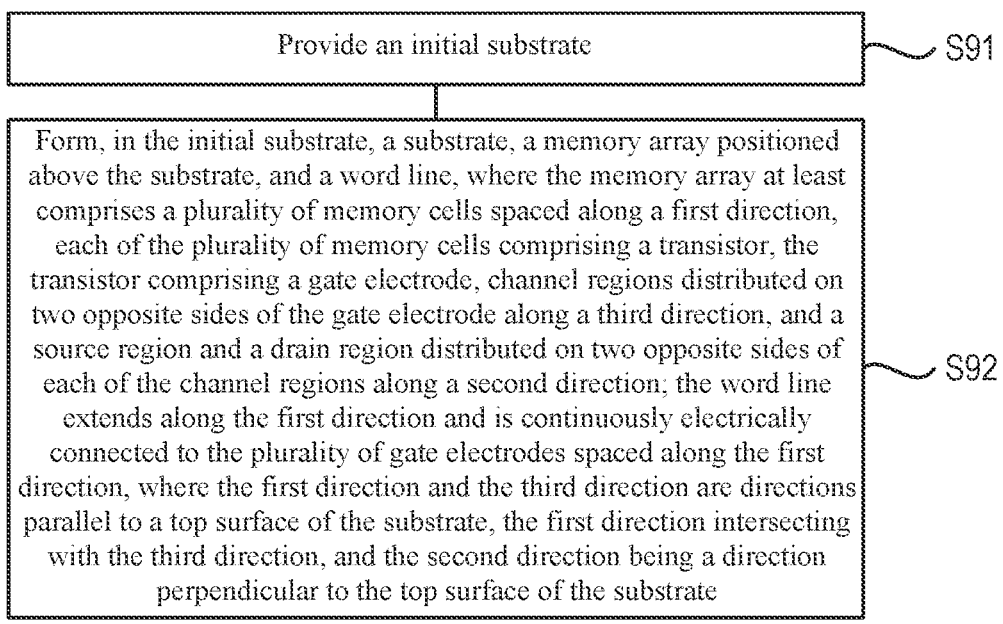
FIG. 9 is a flowchart of a method for forming the semiconductor device according to an embodiment of the present disclosure.
Figure 10:
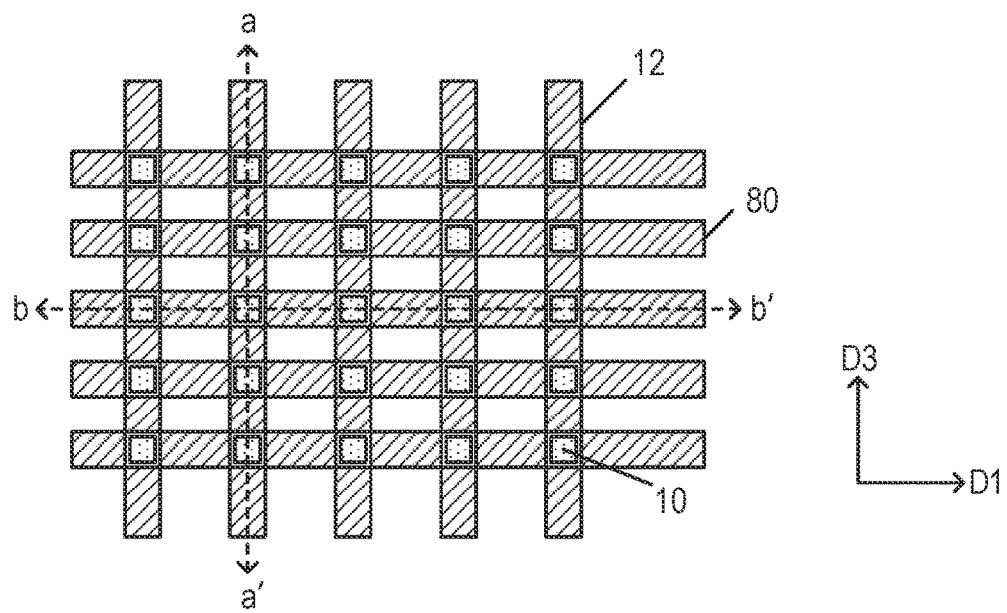
FIGS. 10 to 19 are schematic structural diagrams showing main processes in a process of forming the semiconductor device according to some embodiments of the present disclosure.

This embodiment also provides a method for forming the semiconductor device. FIG. 9 is a flowchart of the method for forming the semiconductor device according to an embodiment of the present disclosure. FIGS. 10 to 19 are schematic structural diagrams showing main processes in a process of forming the semiconductor device according to some embodiments of the present disclosure, where FIG. 10 is a schematic top-down view of the semiconductor device formed in this embodiment, and FIGS. 11 to 19 are schematic cross-sectional views showing main processes in a process of forming the semiconductor device at an a-a' position and a b-b' position in FIG. 10, to clearly show the formation process of the semiconductor device. The structure of the semiconductor device formed in this embodiment may be seen in FIG. 1, FIGS. 2A to 2B, FIG. 3, FIGS. 4A to 4B, FIG. 5, FIGS. 6A to 6B, FIG. 7, and FIGS. 8A to 8B. As shown in FIG. 1, FIGS. 2A to 2B, FIG. 3, FIGS. 4A to 4B, FIG. 5, FIGS. 6A to 6B, FIG. 7, FIGS. 8A to 8B, and FIGS. 9 to 19, the method for forming the semiconductor device includes following steps.

Step S91, providing an initial substrate.

In some embodiments, the initial substrate may be, but is not limited to, a silicon substrate. This embodiment is described by taking an example where the initial substrate is the silicon substrate. In other embodiments, the initial substrate may be a semiconductor substrate such as gallium nitride, gallium arsenide, gallium carbide, silicon carbide, or silicon on insulator (SOI).

Figure 16:
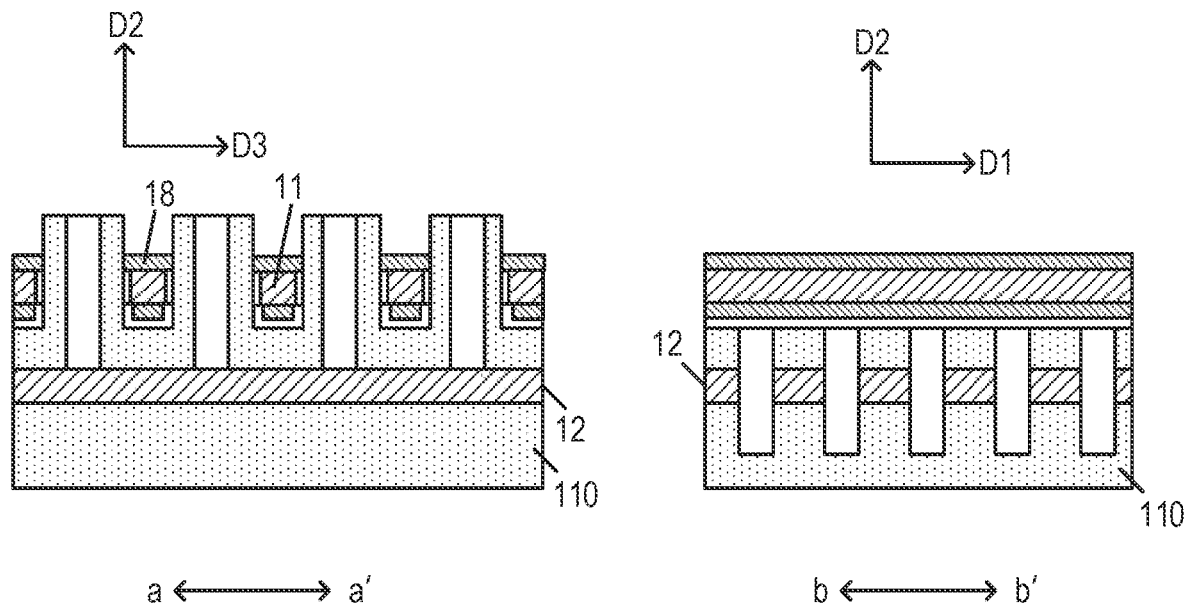

Step S92, forming, in the initial substrate, a substrate 100, a memory array positioned above the substrate 100, and a word line 80, where the memory array at least comprises a plurality of memory cells spaced along the first direction D1. Each of the plurality of memory cells comprises a transistor, where the transistor comprises a gate electrode 11, channel regions 14 distributed on two opposite sides of the gate electrode 11 along the third direction D3, and a source region 13 and a drain region 15 distributed on two opposite sides of each of the channel regions 14 along the second direction D2. The word line 80 extends along the first direction D1 and is continuously electrically connected to the plurality of gate electrodes 11 spaced along the first direction D1, where the first direction D1 and the third direction D3 are directions parallel to the top surface of the substrate 110, the first direction D1 intersects with the third direction D3, and the second direction D2 is a direction perpendicular to the top surface of the substrate 110, as shown in FIG. 1, FIG. 10, and FIG. 16.

Figure 11:
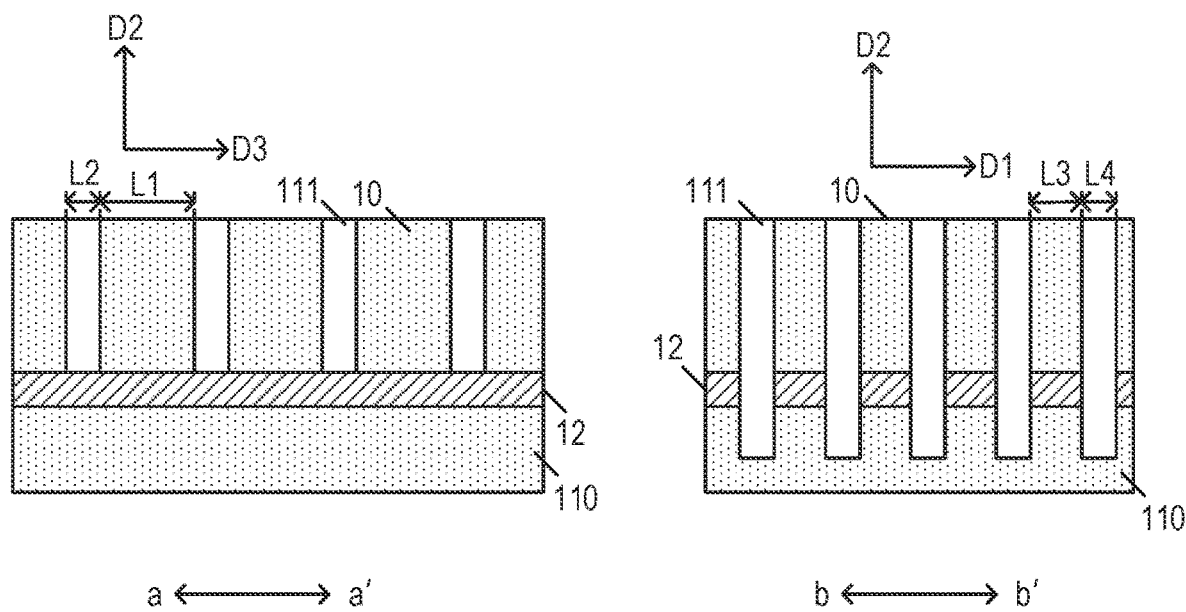
Figure 12:
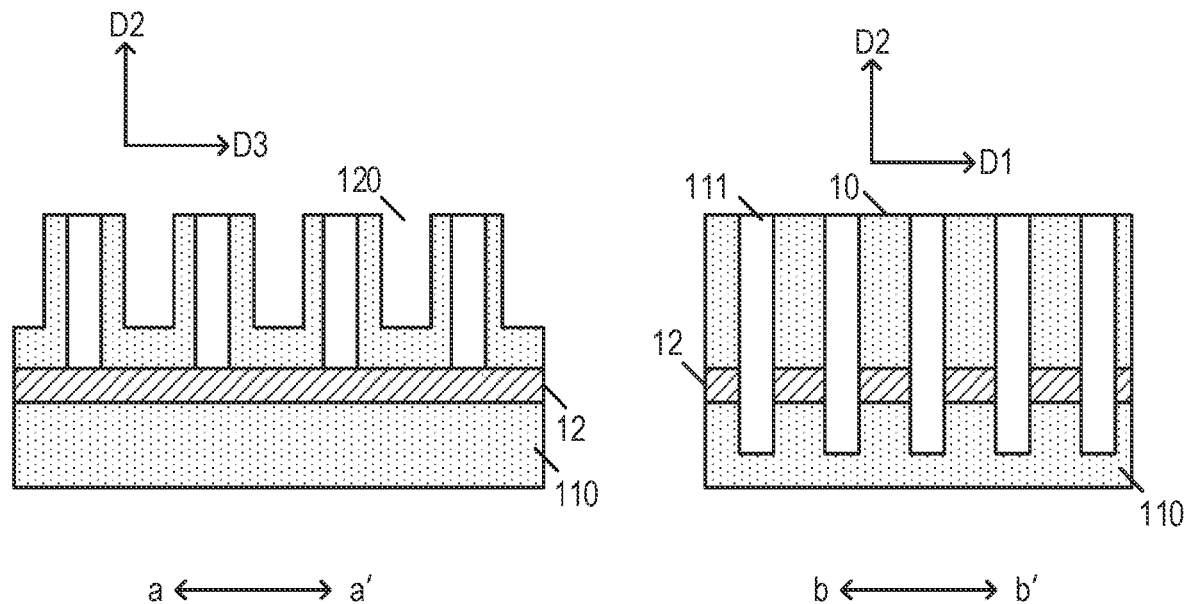

In some embodiments, the step of forming, in the initial substrate, the substrate 100, the memory array positioned above the substrate 100, and the word line 80 includes: etching the initial substrate to form a plurality of first trenches and a plurality of active pillars 10 spaced at least along the first direction D1, where a portion of the initial substrate remained below the first trench serves as the substrate 100, as shown in FIG. 11; defining, in the active pillars 10, a channel region 14, and a source region 13 and a drain region 15 distributed on two opposite sides of the channel region 14 along the second direction D2, as shown in FIG. 1; forming a second trench 120 penetrating through the drain region 15 and the channel region 14 along the second direction D2, as shown in FIG. 12; and forming, in the second trench 120, the gate electrode 11 and the word line 80 extending along the first direction D1 and being continuously electrically connected to the plurality of gate electrodes 11 spaced along the first direction D1.

In some embodiments, the initial substrate is etched to form the plurality of first trenches for dividing the initial substrate into the plurality of active pillars 10 arrayed along the first direction D1 and the third direction D3, where the third direction D3 is a direction parallel to a top surface of the substrate 110, and the third direction D1 intersects with the first direction D1. The intersection in this embodiment may be an oblique intersection or a vertical intersection. To facilitate subsequent formation of the gate electrode 11 in the active pillar 10, a width of the active pillar 10 along the third direction D3 may be 30 nm to 40 nm, a width of the active pillar 10 along the first direction D1 may be 15 nm to 20 nm, and a width of the first trench along the first direction D1 and a width of the first trench along the third direction D3 may be 15 nm to 20 nm. Next, after a protective layer covering the active pillar 10 is formed on a side wall of the first trench, the initial substrate is continued to be etched along the first trench to form grooves positioned below the first trench and continuously communicating with the plurality of first trenches spaced along the third direction D3. Next, a bit line material is filled in the groove to form a bit line 12 extending along the third direction D3, as shown in FIG. 10 and FIG. 11. Next, an insulating dielectric material such as oxide (e.g., silicon dioxide) is filled in the first trench to form a third isolation layer 111, which is configured to electrically isolate adjacent active pillars 10.

Next, the active pillar 10 may be etched by means of a double pattern photolithographic process to form a second trench 120 penetrating through the drain region 15 and the channel region 14 along the second direction D2, as shown in FIG. 12.

Figure 15:
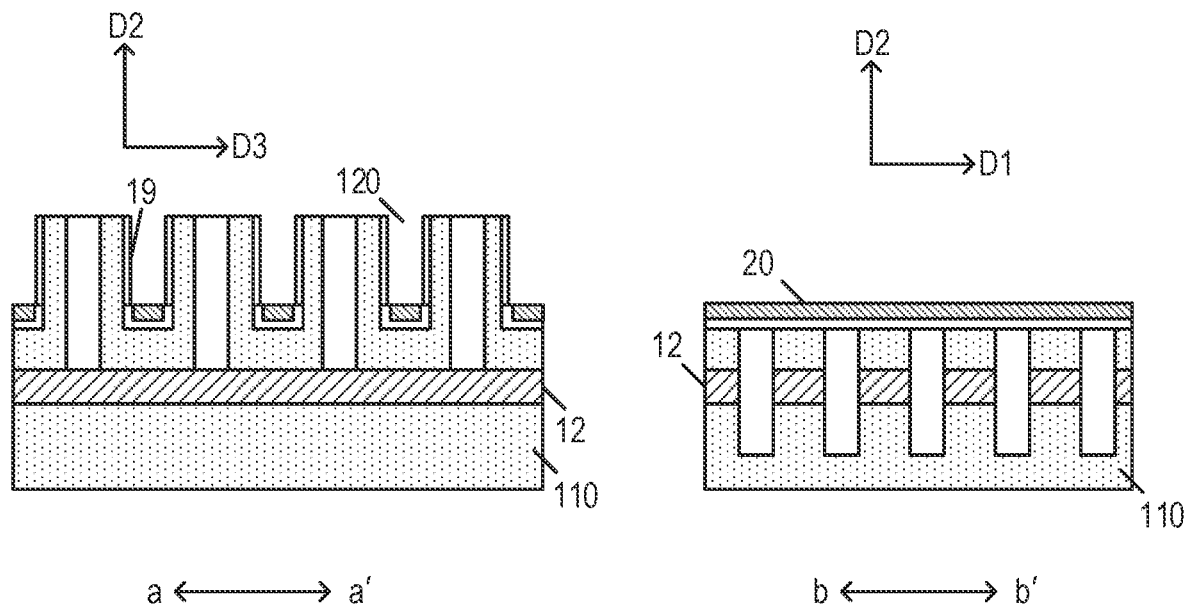

In some embodiments, the step of forming, in the second trench 120, the gate electrode 11 and the word line 80 extending along the first direction D1 and being continuously electrically connected to the plurality of gate electrodes 11 spaced along the first direction D1 includes: forming a first isolation layer on a bottom surface of the second trench 120; forming, on a side wall of the second trench 120, a gate dielectric layer 19 covering the channel region 14, as shown in FIG. 15; and forming, in the second trench 120, the gate electrode 11 covering the gate dielectric layer 19 and the first isolation layer, and simultaneously forming the word line 80 extending along the first direction D1 and being continuously electrically connected to the plurality of gate electrodes 11 spaced along the first direction D1.

In some embodiments, after forming, in the second trench 120, the gate electrode 11 and the word line 80 extending along the first direction D1 and being continuously electrically connected to the plurality of gate electrodes 11 spaced along the first direction D1, the method further includes following steps of: forming, in the second trench 120, a second isolation layer 18 covering a top surface of the gate electrode 11, as shown in FIG. 16; and forming, above the second isolation layer 18, the capacitor structure electrically connected to the drain region 15.

Figure 17:
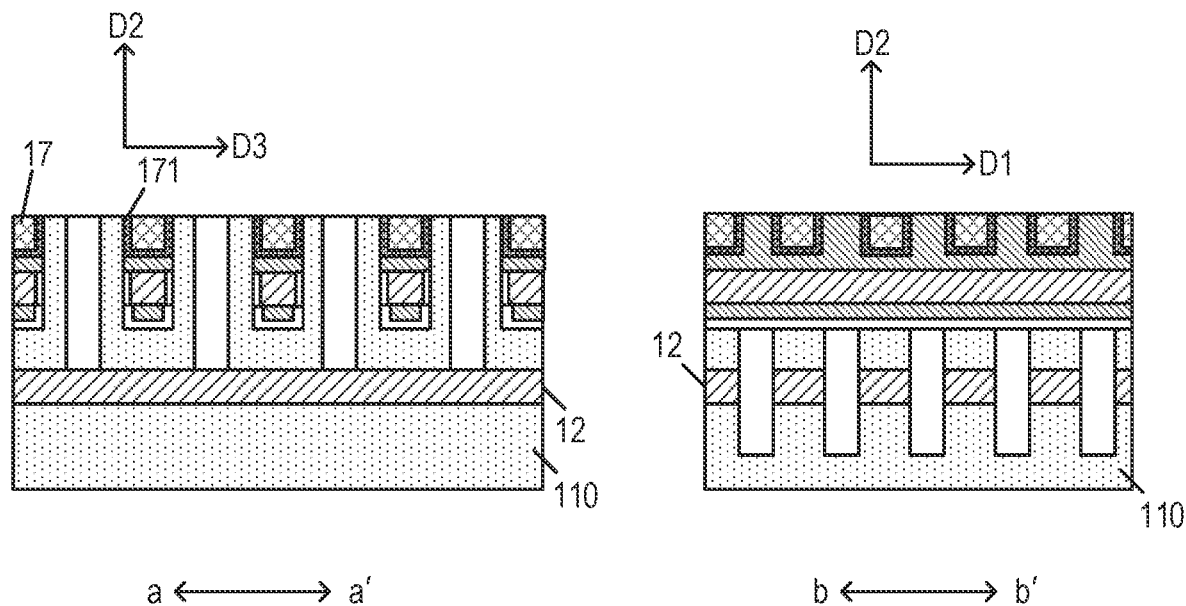
Figure 18:
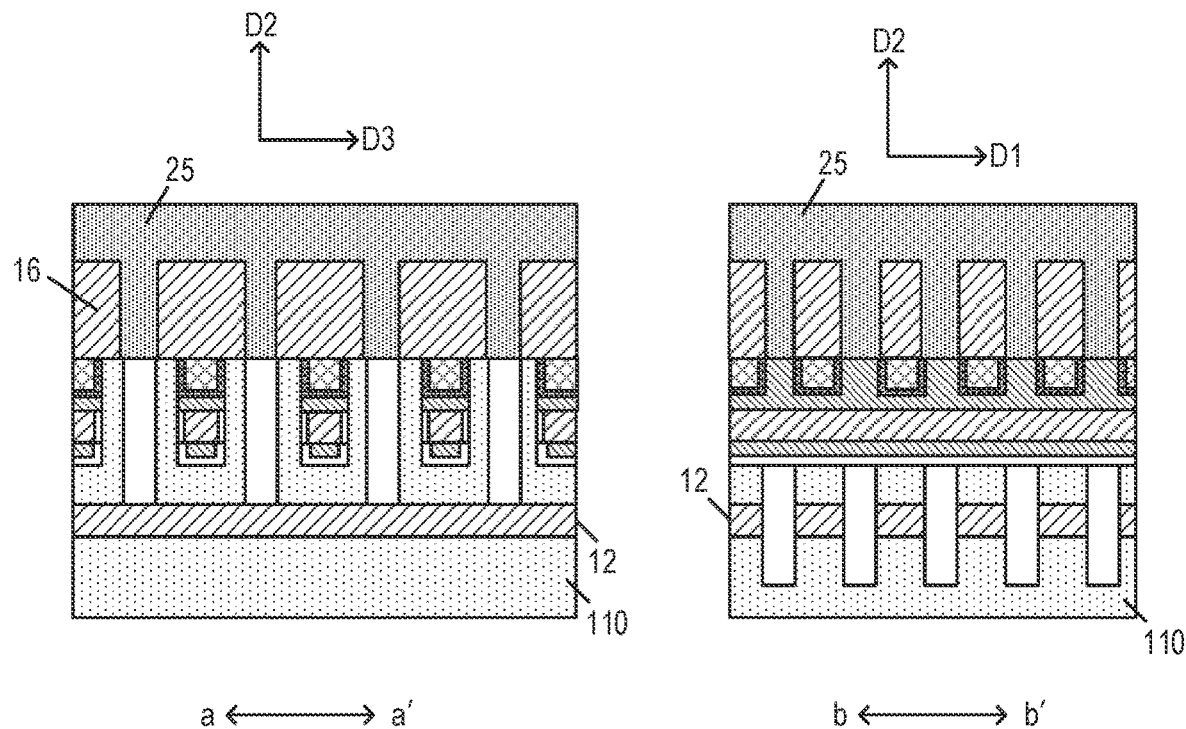

In some embodiments, the step of forming, above the second isolation layer 18, the capacitor structure electrically connected to the drain region 15 includes: forming, in the second trench 120, a capacitor contact 17 positioned on a surface of the second isolation layer 18 and electrically connected to the drain region 15, as shown in FIG. 17; and forming, above the capacitor contact 17, a capacitor 16 electrically connected to the capacitor contact 17, as shown in FIG. 18.

Figure 13:
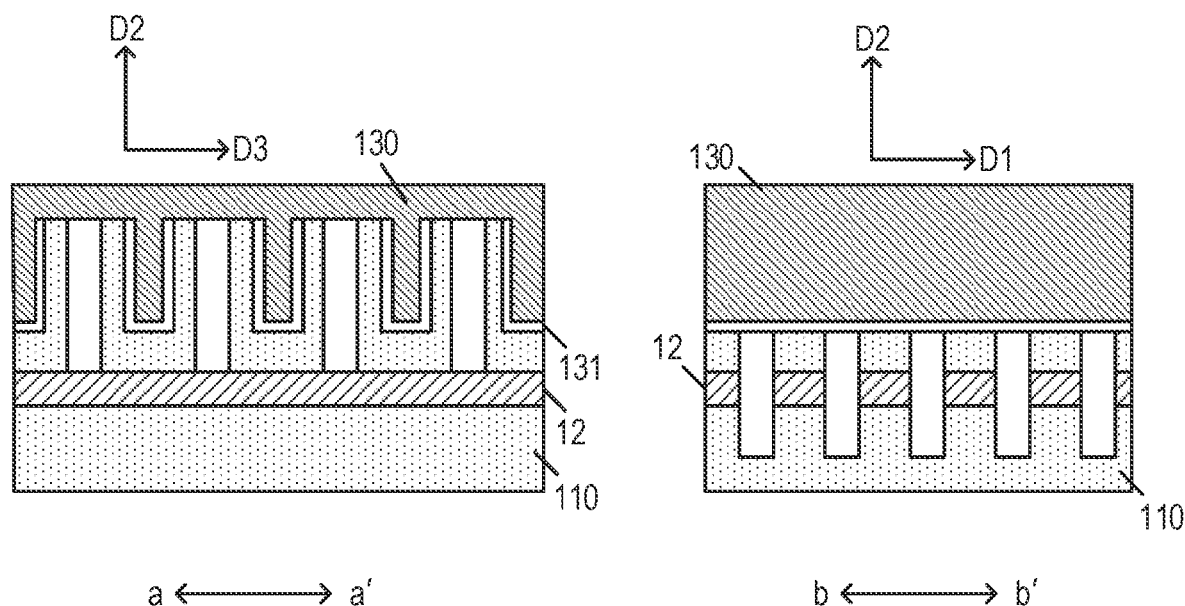
Figure 14:
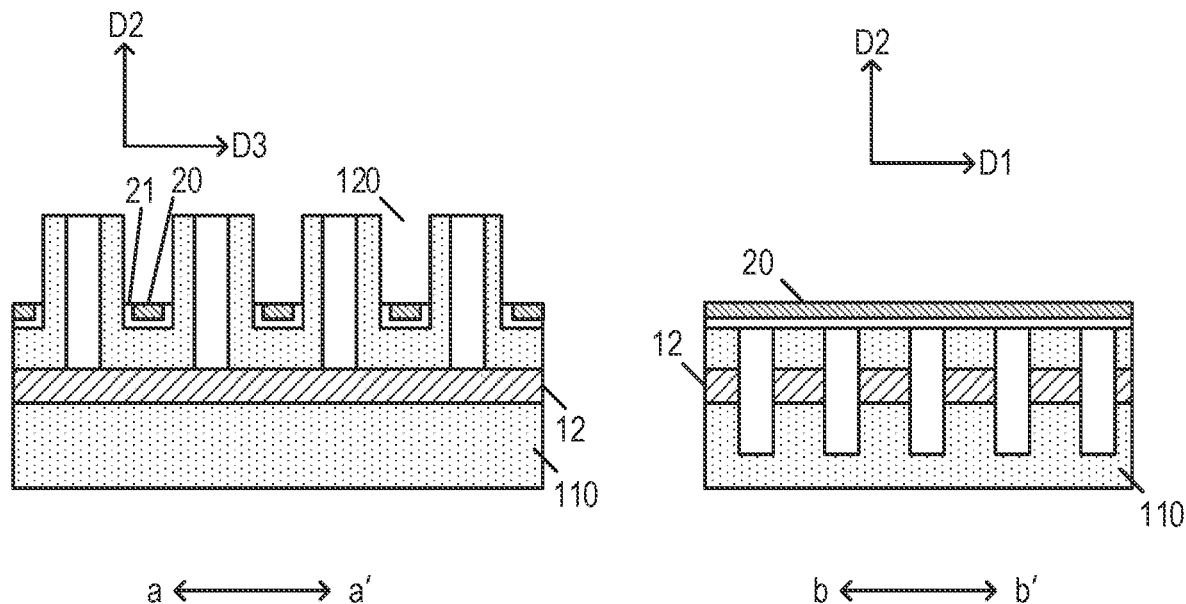

For example, an initial first sub isolation layer 131 covering an inner wall of the second trench 120, and an initial second sub isolation layer 130 filling up the second trench 120 and covering a surface of the initial first sub isolation layer 131 may be formed by means of an atomic layer deposition process, as shown in FIG. 13. A material of the initial first sub isolation layer 131 may be, but not limited to, oxide (such as silicon dioxide), and a material of the initial second sub isolation layer 130 may be, but not limited to, nitride (such as silicon nitride). Next, part of the initial first sub isolation layer 131 and part of the initial second sub isolation layer 130 are etched back, a portion of the initial first sub isolation layer 131 remained at a bottom of the second trench 120 serves as a first sub isolation layer 21, a portion of the initial second sub isolation layer 130 remained above the first sub isolation layer 21 serves as a second sub isolation layer 20, and the first sub isolation layer 21 and the second sub isolation layer 20 together serve as the first isolation layer, as shown in FIG. 14. Next, a gate dielectric layer 19 covering a side wall of the second trench 120 is formed in the second trench 120 by means of an in situ steam generation (ISSG) process or a rapid thermal oxidation (RTO) process, as shown in FIG. 15.

Next, a conductive material such as TiN or tungsten is deposited in the plurality of second trenches 120 to form initial word lines filling up the second trenches 120, extending along the first direction D1 and continuously covering the plurality of gate dielectric layers 19 spaced along the first direction D1. The initial word line and the gate dielectric layer 19 are etched back to expose the drain region 15 in the active pillar, only the gate dielectric layer 19 on the surface of the channel region 14 is retained, a portion of the remaining initial word line surrounded by the channel region 14 serves as the gate electrode 11, and the initial word line positioned between adjacent gate electrodes 11 serves as the word line 80. Next, an insulating dielectric material such as nitride (e.g., silicon nitride) is deposited in the second trench 120 to form a second isolation layer 18 covering the top surface of the gate electrode 11, and a top surface of the second isolation layer 18 is positioned below the top surface of the second trench 120, as shown in FIG. 16.

Next, a conductive material such as TiN is deposited on the inner wall of the second trench 120 to form a diffusion barrier layer 171 positioned above the second isolation layer 18. A conductive material such as tungsten is deposited in the second trench 120 to form the capacitor contact 17 covering a surface of the diffusion barrier layer 171 and filling up the second trench 120. Next, a plurality of capacitors 16 electrically connected to the capacitor contacts 17 are formed above each of the capacitor contacts 17, and a common electrode layer 25 continuously covering the upper electrode layers of the plurality of capacitors 16 is formed, as shown in FIG. 18.

Figure 19:
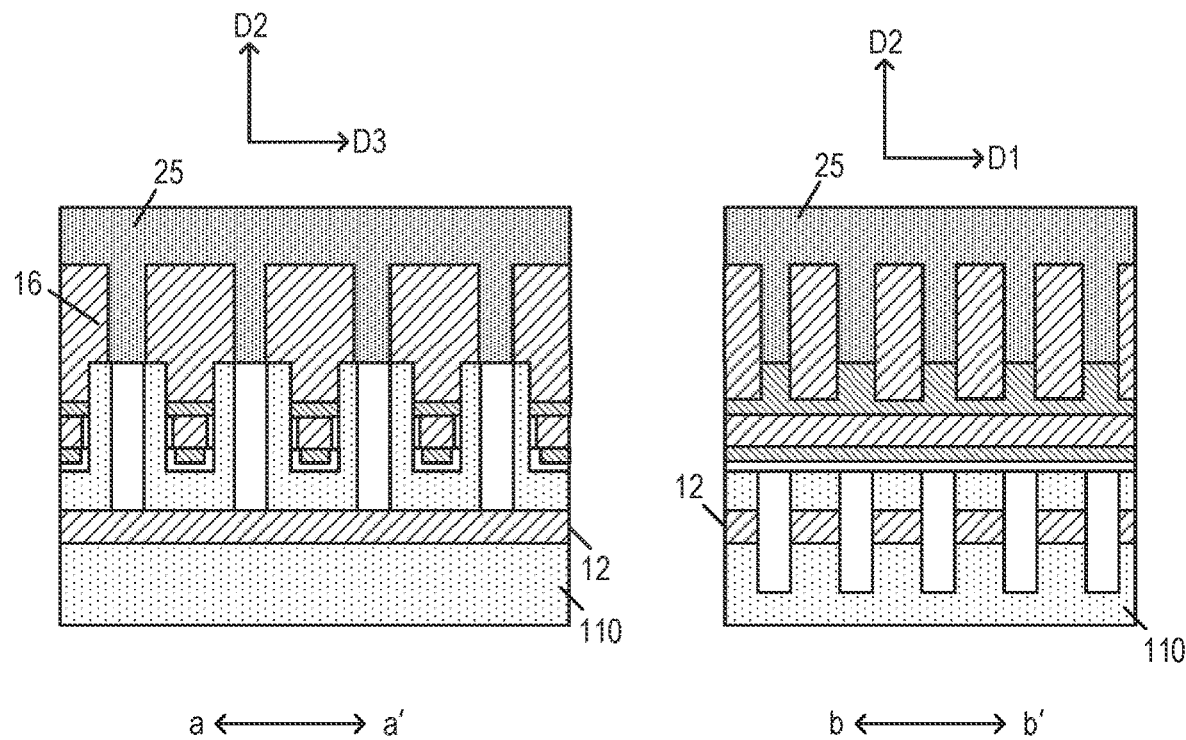

In some other embodiments, the step of forming, above the second isolation layer 18, the capacitor structure electrically connected to the drain region 15 includes: forming a capacitor 16 on a surface of the second isolation layer 18, where at least part of the capacitor 16 is positioned in the second trench 120, as shown in FIG. 19.

In some embodiments, to simplify the fabrication processes and reduce the contact resistance between the capacitor 16 and the drain region 15, after the second isolation layer 18 is formed, the capacitor contact 17 may not be formed, instead the capacitor 16 begins to be formed directly in the second trench 120, such that the drain region 15 is distributed around the side wall of at least part of the capacitor 16.

According to the semiconductor device and the method for forming the same provided by some embodiments of the present disclosure, the channel regions are arranged on two opposite sides of the gate electrode to form a fully depleted gate electrode, and an arrangement direction of the source region, the channel regions, and a drain region in the transistor intersects with an extension direction of the word line. The semiconductor device is compact in structure, such that the integration level of the semiconductor device can be improved, the size of the semiconductor device can be reduced, and the yield of the semiconductor device can be increased. In addition, the gate electrode in some embodiments of the present disclosure is formed by directly filling a second trench after formation of the second trench in an active pillar, and the fabrication process is simple, thereby reducing fabrication difficulty of the semiconductor device.

The above merely are embodiments of the present disclosure. It is to be pointed out that to those of ordinary skill in the art, various improvements and embellishments may be made without departing from the principles of the present disclosure, and these improvements and embellishments are also deemed to be within the scope of protection of the present disclosure.

What is claimed is:

1. A semiconductor device, comprising:
    a substrate;
    a memory array positioned on the substrate and at least comprising a plurality of memory cells spaced along a first direction, each of the plurality of memory cells comprising a transistor, the transistor comprising a gate electrode, channel regions distributed on two opposite sides of the gate electrode along a third direction, and a source region and a drain region distributed on two opposite sides of each of the channel regions along a second direction, the first direction and the third direction being directions parallel to a top surface of the substrate, the first direction intersecting with the third direction, and the second direction being a direction perpendicular to the top surface of the substrate; and
    a word line extending along the first direction and being continuously electrically connected to the plurality of gate electrodes spaced along the first direction.

2. The semiconductor device according to claim 1, wherein a width of the gate electrode along the third direction is greater than or equal to a width of the word line along the third direction.

3. The semiconductor device according to claim 1, further comprising:
    a bit line positioned below the transistor and extending along the third direction, the bit line being electrically connected to the source region.

4. The semiconductor device according to claim 1, wherein each of the plurality of memory cells further comprises:
    a capacitor structure positioned above the transistor along the second direction, the capacitor structure being electrically connected to the drain region;

a first isolation layer positioned between the source region and the gate electrode; and a second isolation layer positioned between the capacitor structure and the gate electrode.

5. The semiconductor device according to claim 4, wherein the capacitor structure comprises:

a capacitor contact positioned above the gate electrode, the drain region being distributed around a side wall of the capacitor contact; and a capacitor positioned above the capacitor contact and being electrically connected to the capacitor contact.

6. The semiconductor device according to claim 5, wherein the capacitor comprises:

a lower electrode layer being columnar and extending along the second direction, the lower electrode layer being electrically connected to the drain region;

a dielectric layer covering a surface of the lower electrode layer; and an upper electrode layer covering a surface of the dielectric layer.

7. The semiconductor device according to claim 5, wherein the capacitor comprises:

a lower electrode layer extending along the second direction and being electrically connected to the drain region, a cross section of the lower electrode layer being U-shaped;

a dielectric layer covering a surface of the lower electrode layer; and an upper electrode layer covering a surface of the dielectric layer.

8. The semiconductor device according to claim 4, wherein the capacitor structure comprises:

a capacitor positioned above the gate electrode, the drain region being distributed around a side wall of part of the capacitor.

9. The semiconductor device according to claim 4, wherein the capacitor structure comprises:

a capacitor terminal covering a top surface of the drain region; and a capacitor positioned above the capacitor terminal and being electrically connected to the capacitor terminal.

* * * * *